(12) United States Patent
Thornton

(10) Patent No.: US 10,274,542 B1
(45) Date of Patent: Apr. 30, 2019

(54) ELECTRICAL GENERATOR TESTING APPLIANCE

(71) Applicant: Professional Generator Testers LLC, Sugar Grove, OH (US)

(72) Inventor: Roger E. Thornton, Sugar Grove, OH (US)

(73) Assignee: Professional Generator Testers LLC, Sugar Grove, OH (US)

( * ) Notice: Subject to any disclaimer, the term of this patent is extended or adjusted under 35 U.S.C. 154(b) by 0 days.

(21) Appl. No.: 16/201,014

(22) Filed: Nov. 27, 2018

(51) Int. Cl.
*G01R 31/34* (2006.01)

(52) U.S. Cl.
CPC .................. *G01R 31/343* (2013.01)

(58) Field of Classification Search
CPC ...... G01R 31/343; G01R 31/48; G01R 31/34; G01R 31/2603; G01R 31/12; G01R 31/14; G01R 31/02; G01R 31/025; G01R 31/1272; G01R 31/1227; G01R 31/2839; G01R 31/31912; G01R 31/318314; G01R 27/02; G01R 27/14
See application file for complete search history.

(56) References Cited

U.S. PATENT DOCUMENTS

| | | | |
|---|---|---|---|
| 2,096,131 A | 10/1937 | Oestermeyer | |
| 2,508,367 A | 5/1950 | Bloom | |
| 2,826,737 A | 3/1958 | Crumbliss | |
| 4,164,701 A * | 8/1979 | Gulledge | G01R 31/02 324/508 |
| 4,256,936 A * | 3/1981 | Lancaster | H01R 13/582 200/51.07 |
| 4,445,047 A | 4/1984 | Cannon | |
| 4,658,213 A | 4/1987 | Finley | |
| 4,682,103 A | 7/1987 | DeNardis | |
| 4,798,082 A | 1/1989 | Fujikawa et al. | |
| 5,416,416 A | 5/1995 | Bisher | |

(Continued)

FOREIGN PATENT DOCUMENTS

DE 10214279 A1 10/2003
IN 01371ko2014 7/2016

OTHER PUBLICATIONS

Flight Systems, Inc., Model 360-G-MAN Onan RV Gen Set Service, https://www.flightsystems.com/standby-generator-ats-controls/model-360-gman-mobile-generator-tester.html, May 1, 2018, pp. 1-2.

*Primary Examiner* — Thang X Le
(74) *Attorney, Agent, or Firm* — Frank H. Foster; Kremblas & Foster

(57) ABSTRACT

A generator testing appliance for use in servicing an electrical power generation unit that has a generator connected to a controller. Within a cabinet are multiple conductive circuit paths each having an electrically interposed main switch that is mounted to the cabinet. Multiple conductor controller leads are each connected at one end to a first end of a different one of the conductive circuit paths and are connected or connectable at their opposite ends to a different one of the terminals of the controller. Multiple conductor generator leads are connected at one end to the opposite second end of a different one of the conductive circuit paths and at their opposite ends to a different one of the terminals of the generator. Multiple meter test lead ports that are accessible from the exterior of the cabinet are electrically connected to a terminal of a different one of the main switches.

11 Claims, 4 Drawing Sheets

(56) References Cited

U.S. PATENT DOCUMENTS

| | | | | |
|---|---|---|---|---|
| 5,469,063 | A * | 11/1995 | Winter | G01R 19/155 |
| | | | | 324/508 |
| 6,028,423 | A * | 2/2000 | Sanchez | G01R 31/002 |
| | | | | 324/750.26 |
| 6,351,130 | B1 | 2/2002 | Preiser et al. | |
| 6,815,956 | B2 * | 11/2004 | Weldin | G01R 31/14 |
| | | | | 324/511 |
| 7,560,822 | B1 | 7/2009 | Hoffmann | |
| 7,714,569 | B2 * | 5/2010 | Li | H01R 31/06 |
| | | | | 324/756.05 |
| 8,108,162 | B2 | 1/2012 | Matsumoto | |
| 8,319,517 | B2 | 11/2012 | Eishaer | |
| 8,957,698 | B2 | 2/2015 | Cop | |
| 9,331,459 | B2 | 5/2016 | Clark | |
| 9,496,823 | B2 | 11/2016 | Shigemura et al. | |
| 9,755,458 | B2 | 9/2017 | Frampton | |
| 9,866,161 | B1 | 1/2018 | Johnson et al. | |
| 2003/0173828 | A1 | 9/2003 | Bachinski et al. | |
| 2003/0224833 | A1 | 12/2003 | Egan et al. | |
| 2005/0200373 | A1 * | 9/2005 | Yakymyshyn | G01R 1/06788 |
| | | | | 324/754.23 |
| 2006/0119365 | A1 | 6/2006 | Makhija | |
| 2011/0018579 | A1 * | 1/2011 | Stanton | G01R 31/40 |
| | | | | 324/764.01 |
| 2011/0295436 | A1 | 12/2011 | Haynes et al. | |
| 2018/0097354 | A1 | 4/2018 | Yoscovich et al. | |

\* cited by examiner

ELECTRICAL GENERATOR TESTING APPLIANCE

BACKGROUND OF THE INVENTION

This invention is directed to a generator testing appliance that assists a service technician when servicing an electrical power generation unit and more particularly is directed to an electrical circuit that the service technician electrically interposes in connection between an electrical generator and its controller in order to facilitate making measurements of electrical parameters of the circuit. With the generator testing appliance of the invention the service technician is able to analyze and diagnose the generator more quickly, more conveniently and with enhanced safety, when working to find a fault that is causing the generator to malfunction.

Referring to FIG. 1, a typical modern prime and standby electrical power generation unit 10 comprises an electromechanical generator 12 having stator and rotor windings that are connected to a controller 14. The electromechanical generator 12 is driven by an engine, such as a propane or gasoline fueled internal combustion engine 16. The controller 14 both senses voltage and/or current parameters from the windings and adjusts and controls other voltage and/or current parameters of the windings. Commonly, selected internal circuit nodes of the controller 14 are electrically connected to controller electrical terminals that may be connected to a manually separable controller connector 18. Similarly, selected internal circuit nodes of the electromechanical generator 12 are electrically connected through a cable 20 to generator electrical terminals that are connected to a manually separable generator connector 22 that mates with the controller connector 18. During normal generator operation, the generator 12 and controller electrical terminals are connected together either by directly connecting their respective connectors 18 and 22 to each other or by cables or other conductors that have connectors at their opposite ends that mate with the connectors of the generator and controller terminals. The term "cable" is used to refer to a group of multiple conductors whether or not they are bundled together by being enveloped in a surrounding cover or sheath.

When a generator malfunctions, a technician is called in to diagnose the problem and make an appropriate repair. In order to perform a diagnosis, the technician must perform a series of tests. Most generator manufacturers have manuals that describe recommended tests for troubleshooting problems. For most tests the technician uses a multimeter to read voltage and/or current values at a pair of generator terminals. Although some tests are performed with the generator connected to the controller in the same state as when the generator is operating normally, many tests require that the test be performed after disconnecting one or more electrical connections between the generator and the controller. That is where the problem begins that is solved by the invention.

As now practiced by generator technicians, the manner in which the technician performs the tests that require the disconnection of one or more conductors between the generator terminals and the controller terminals is to manually disconnect the appropriate conductor or disconnect the entire interconnecting cable 20. Then the technician must improvise some temporary connections of selected conductors between the generator and the controller and connect multimeter probes to the terminals as instructed by the manufacturer's manual so the technician can then read measured values. To perform the next test the technician may reconnect the initially disconnected conductor(s) and disconnect one or more others and take the next multimeter reading according to the instructions. Some tests require the disconnection and subsequent reconnection of multiple conductors. The technician usually must repeat this process several times. To do so, each time the technician must reach into the housing for these components, take the time to physically make specific connections and disconnections and then manually hold or attach the multimeter probes in contact with the appropriate terminals or cable ends. Often the appropriate terminals or cable ends are in an inconvenient location where it is difficult to make the appropriate probe contact and/or to hold the probe in continuous contact while reading the multimeter. Sometimes the technician must improvise temporary electrical connections with some kind of jumper or other temporary on-site constructed wiring somewhat like making breadboard connections on an experimental circuit but without easy access to the circuit nodes. These temporary wired connections must also be dismantled before performing the next recommended test.

Performing the above sequence of manual manipulations is not only difficult and time consuming but also often exposes the technician to serious electrical shock hazard especially if the generator is operating while the technician performs these manual manipulations. The purpose and object of this invention is to avoid these problems by making the physical actions for opening and closing selected individual circuits and for connecting the multimeter probes considerably faster, easier and safer. Not only does the invention avoid the described problems but the simplification of the process of connecting and disconnecting circuit connections and properly positioning the multimeter probes also allows the technician to better concentrate and focus on the technical significance of the multimeter readings. Additionally, the invention decreases or eliminates the risk of damaging the terminals of the connectors that can be caused by inserting meter test lead probes directly into the terminals of the connectors.

The prior art has developed some circuits in separate cabinets that connect by cables to a generator for purposes of diagnosis and fault analysis. However, these devices are not interposed between the generator and its controller. They do not maintain the same interconnection circuit paths directly between the generator and the controller that exist during normal operation of the electrical power generation unit. Instead they have internal circuitry (and in some cases have their own data processor and software) that is used as a substitute for all or at least a part of the circuitry that is normally associated with the installed electrical power generation unit. They become a temporary and substitute part of the generator's control system. Consequently the tests are not performed using the generator's own controller. Other prior art exists that connects meters to the generator but also is not interposed between the generator and its associated controller and do not maintain the same interconnection circuit paths that exist during normal operation

BRIEF SUMMARY OF THE INVENTION

The invention has a cabinet for housing at least some of the components of the invention. Within the cabinet are multiple conductive circuit paths. Each circuit path corresponds to one of the circuit paths that exists between an electromechanical generator and its controller during their normal operation. Each circuit path has an electrically interposed main switch that is mounted to the cabinet. The switches are manually operable from the exterior of the cabinet and selectively open and close the conductive circuit path in which a main switch is connected. When the switches are closed, each circuit path is conductive from one end to the other so that the invention can be interposed between the generator and the controller and be in a state that connects them in their normal connection.

Multiple conductor controller leads each have an end connected to a first end of a different one of the conductive circuit paths. Each controller lead has an opposite end connected or connectable to a different one of the terminals of the controller that controls the operation of the electro-mechanical generator.

Multiple conductor generator leads each have an end connected to a second end of a different one of the conductive circuit paths. The opposite end of each generator lead is connected or connectable to a different one of the terminals of the electro-mechanical generator.

The invention also has multiple meter test lead ports mounted to the cabinet and accessible from the exterior of the cabinet. Each test lead port is electrically connected to a terminal of a different one of the main switches.

Figure 1:
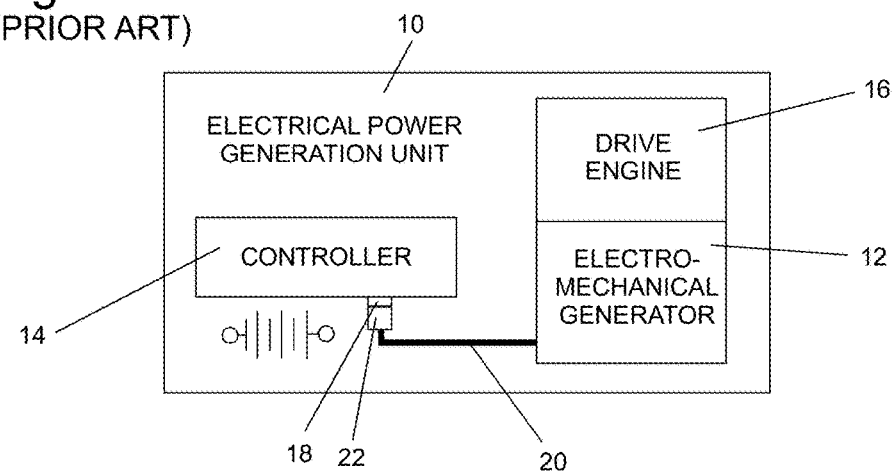
FIG. 1 is a block diagram illustrating the normal connections of an electrical power generation unit.

In describing the preferred embodiment of the invention which is illustrated in the drawings, specific terminology will be resorted to for the sake of clarity. However, it is not intended that the invention be limited to the specific term so selected and it is to be understood that each specific term includes all technical equivalents which operate in a similar manner to accomplish a similar purpose.

DETAILED DESCRIPTION OF THE INVENTION

General Overview

Figure 2:
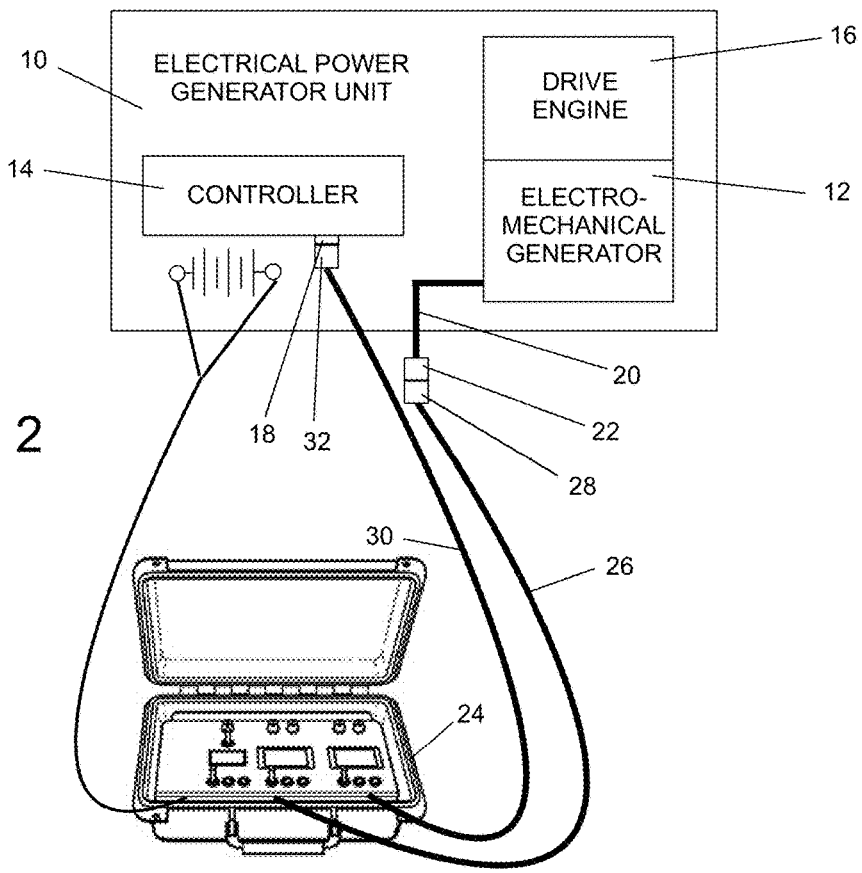
FIG. 2 is a block diagram illustrating the interposed connection of an embodiment of the invention between the electro-mechanical generator and its controller.

Referring to FIG. 2, an embodiment of the invention (hereinafter referred to simply as the invention) has a separate, portable cabinet 24 with internal circuitry and with terminals and connectors that are connected to various places in its internal circuit. When used by the technician, the generator's controller 14 is first disconnected from the generator 12. Then the invention is electrically interposed between the generator 12 and its controller 14.

To do that, there is a multi-conductor set of generator leads that form a cable 26 extending from the circuitry within the cabinet 24 to a tester/generator connector 28 for connecting to the generator terminals at the generator connector 22. Similarly, there is a multi-conductor set of controller leads that form a cable 30 extending from the circuitry within the cabinet 24 to a tester/controller connector 32 for connecting to the controller terminals at the controller connector 18. A "lead" is a length of flexible wire or multiple wires preferably surrounded by flexible insulation. Control signals and feedback sensed signals between the generator and the controller now pass through the interposed circuit of the invention where they are available for metering by meters mounted to the cabinet 24 and for connection to a multimeter. Alternatively, the cables 26 and 30 can be connected to the cabinet 24 (and its interior circuitry) by manually separable connectors.

The internal circuitry of the invention has multiple conductive circuit paths each corresponding to a different one of the circuit paths between the generator and its controller when the generator and the controller are connected together in their normal operating manner. The term "normal" means when operating properly and not being serviced. However, these circuit paths additionally have connections to shrouded meter test lead ports, onboard ammeters and voltmeters as well as manually operable switches that can be switched by the technician. The term "meter test lead ports" is used to refer to a terminal with a conductive metal surface that is electrically connected to internal conductors but is accessible to a meter probe. The meter test lead ports are preferably shrouded with an insulating material in order to prevent contact of the metal by human body parts. A typical example has a central opening with the conductive metal surface being recessed and surrounded by insulating material.

When the manually operable switches in each conductive circuit path are in their preferred initial state, the electrical connections (i.e. the circuit paths through the invention) between the controller 14 and the generator 12 are identical to the electrical connections that exist when the controller 14 is directly connected to the generator 12 for normal operation in the manner illustrated in FIG. 1. The manual actuators of the switches in the circuit of the invention and various shrouded meter test lead ports are accessible to the technician on the top control panel of the invention. The technician can read the values of some circuit voltages and currents on the onboard ammeters and voltmeters. More importantly, the technician can insert the probes of a conventional multimeter into any of the shrouded meter test lead ports on the top control panel. Most importantly, the technician can switch one or more selected switches to a different state. Each of several main switches opens a circuit path from the controller to a generator winding terminal. A shrouded meter test lead port that is connected to the input terminal of each of the switches provides multimeter access by the technician to any of the conductive circuit paths between the generator and the controller. Consequently, with a minimum of manual manipulation the technician can modify the circuit to provide many different connection states by opening and closing a selected one or more of the conductive circuit paths between the generator and its controller. After each connection state is selected by operating one or more of the main switches, the technician can take circuit parameter readings on both a hand held multimeter and on the onboard meters in a manner that requires only a minimum of manual manipulation.

The advantage of the invention is that the technician simply disconnects the controller from the generator, such as by disconnecting the connectors 18 and 22 and connects the invention so it is interposed between the controller 14 and the generator 12. With the main switches in their initial state the result is that the generator and the controller are electrically connected the same as they are for normal operation. The technician can then very conveniently switch the switches and take measurements in order to perform the recommended tests. The invention eliminates the need to improvise changes of the physical electrical connections for each test. The invention eliminates the need to disconnect and reconnect the various individual circuit paths between the generator and its controller by disconnecting and reconnecting various cables and conductors. Instead of physically changing the electrical circuit paths by improvised wiring, the technician simply throws one or more switches for each test. Furthermore, the desired circuit nodes are conveniently available at the shrouded meter test lead ports on the top control panel of the cabinet 24. There is no need to improvise circuit path variations or disconnections in order to provide access for multimeter probes.

Consequently all voltages and currents and all control and sensed signals are accessible to the technician right at the cabinet 24. Additionally, access to the circuit nodes is free from the risk of the technician mistakenly making physical contact with any of the bare conductors that are inevitably exposed as a result of the prior art requirement for improvised temporary electrical connections. All or only selected operational connections can be maintained between the generator and its controller while measurements or sensing of them is accomplished without physically changing any wiring. Temporary circuit modifications for testing purposes can easily be made by switching selected connections to disconnection while some or all the remaining connections can be left undisturbed. In order to enhance the commercial practicality of embodiments of the invention, multiple sets of custom leads with custom connectors or adapters can be provided to accommodate the different connectors and terminals of each generator manufacturer and model.

Invention Details

Figure 3:
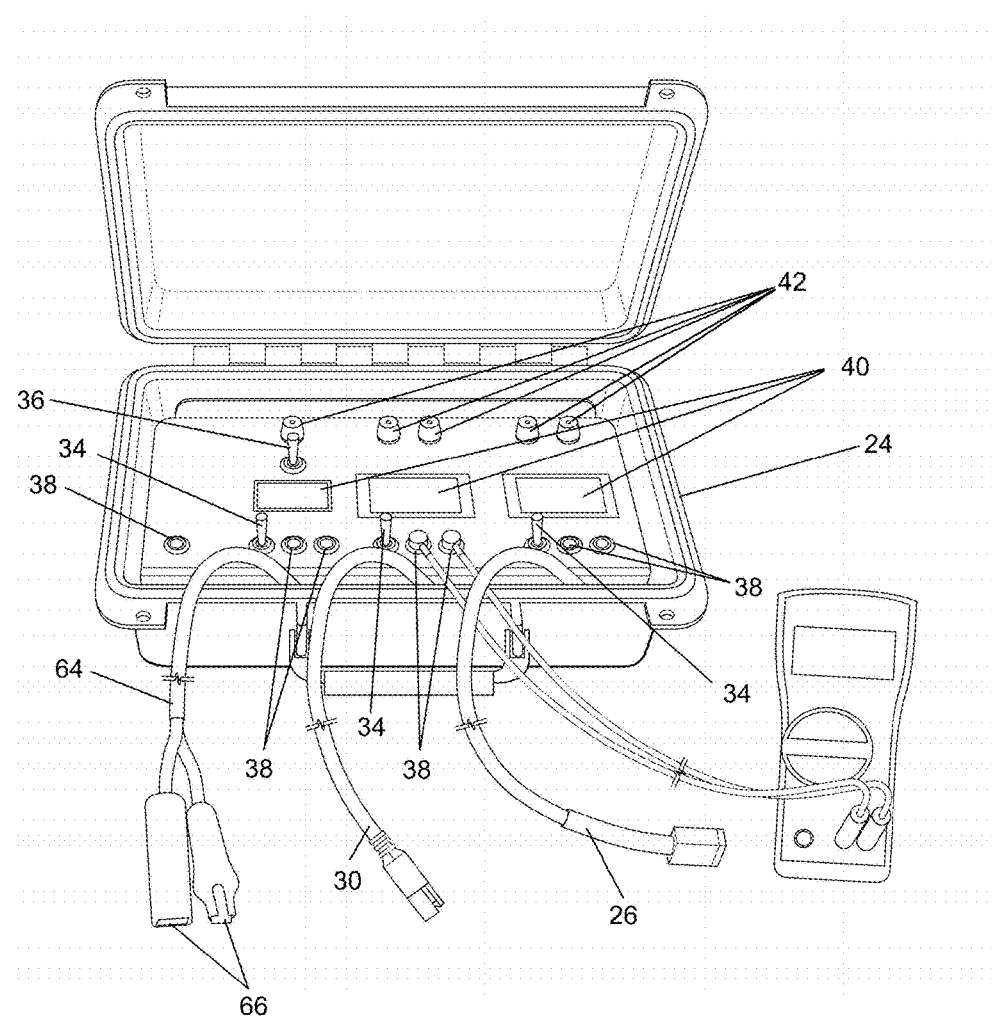
FIG. 3 is a view in perspective of an embodiment of the invention.

Referring to FIG. 3, the cabinet 24 houses at least some of the components of the generator testing appliance embodying the invention. Some of the components are accessible to the technician and include main switches 34, a battery switch 36, multiple shrouded meter test lead ports 38, voltage and current meters 40, and fuses 42. The circuitry is contained within the cabinet 24 and its schematic diagram is illustrated in FIG. 4.

Figure 4:
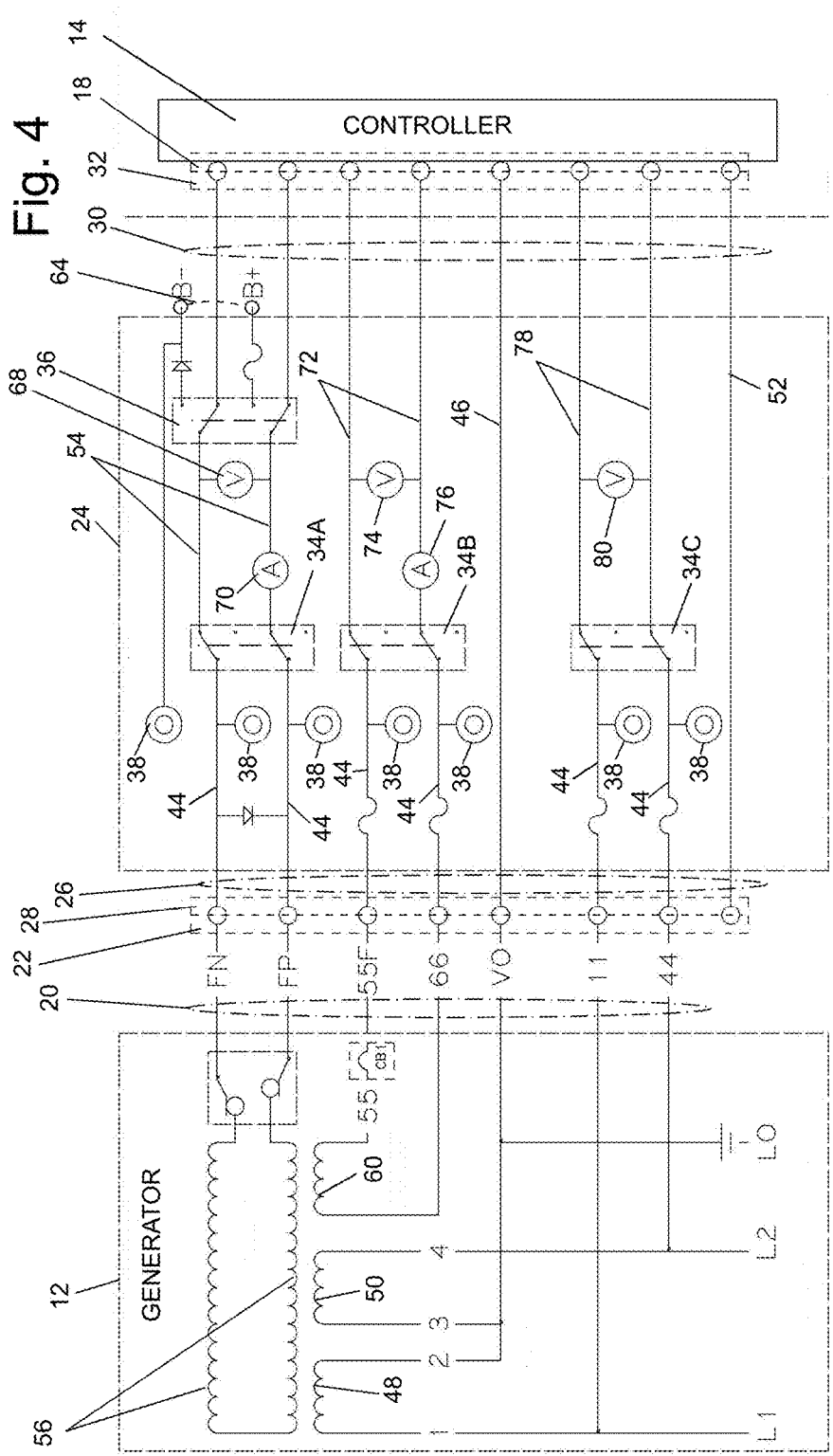
FIG. 4 is a schematic diagram of the circuit of the embodiment of the invention.

Referring to FIG. 4, the circuit within the cabinet 24 has multiple conductive circuit paths 44. When the invention is connected between the generator and the controller and the switches are in their preferred initial state as shown in FIG. 4, the conductive circuit paths 44 form high conductance circuit paths between the generator 12 and the controller 14. In that initial state the invention electrically emulates the prior art connection of the generator 12 to the controller 14. The conductive circuit paths 44 have no non-negligible resistance, capacitance, inductance or impedance combination of them. As known to those skilled in the art, all conductors have some inherent impedance. However, a circuit path that is considered a conductor has only an impedance value that can be ignored because it does not interfere with the circuit operation. For example, an ammeter interposed in a conductive circuit path is designed to have negligible resistance producing a voltage drop across the ammeter that is negligible with respect to the operation of the circuit.

The circuit paths 44 have a plurality of main switches 34 which are individually labelled 34A, 34B and 34C. Each circuit path 44 has an electrically interposed main switch 34A, 34B and 34C that is mounted to the cabinet 24 and is manually operable from the exterior of the cabinet 24. As seen in the schematic, each of the main switches 34A, 34B and 34C can be operated for selectively and manually opening and closing one or more of the conductive circuit paths 44 in which a main switch 34 is connected. As in conventional terminology, the wiper terminal of each switch is referred to as the "input" terminal. The other terminals are the output terminals. Although the switches are shown as DPDT switches, they are connected and operating as DPST switches because one pair of output poles has nothing connected to them. Double pole switches are preferred because they permit the simultaneous switching of both connections to a particular winding of the generator. Of course twice as many single pole switches could be substituted for individually switching each of the circuit paths 44 into and out of connection to each generator winding. The switches in the invention can be mechanical switches, solid state electronic switches, mercury switches or any of the many switches known to those skilled in the art that provide a switching function to open or close a circuit path. In addition to the switched circuit paths, preferably there is additionally provided at least one unswitched circuit path 46 for the neutral of the armature windings 48 and 50 [sometimes called by other names such as "Output Windings", "Stator Windings" or "Alternator Stator Windings".] The armature winding(s) provides the output power of the generator. A second unswitched circuit path 52 is also provided for use of the invention with some three-phase electrical power generator units.

Referring to FIGS. 2 and 4, the multiple conductive circuit paths 44 each have opposite ends. In order to connect the opposite ends of the circuit paths within the cabinet 24 to the generator 12 and the controller 14 there are a pair of multiple conductor leads. Preferably, these multiple conductor leads are encased in an insulating cover to form the cables 26 and 30. The multiple conductor controller leads form cable 30. Each controller lead of cable 30 has one end connected to a first end of a different one of the conductive circuit paths 44 and its opposite end connected or connectable to a different one of the controller terminals. Preferably, the controller leads of cable 30 are connected to the controller terminals through a tester/controller connector 32 that is electrically wired to the cable 30 and matingly connects to the controller connector 18.

The multiple conductor generator leads form the cable 26. Each generator lead of cable 26 has one end connected to the second end of a different one of the conductive circuit paths 44 and its opposite end connected or connectable to a different one of the electrical generator terminals. Preferably, the generator leads of cable 26 are connected to the generator terminals through a tester/generator connector 28 that is electrically wired to the cable 26 and matingly connects to the generator connector 22. The connectors 18, 22, 28, and 32 are shown symbolically in FIG. 4 as dashed line rectangles in the limited space of the schematic.

The shrouded meter test lead ports 38 are mounted to the cabinet 24 and are accessible from the exterior of the cabinet 24 so that the technician can conveniently connect a multimeter to any two of them at any time. Each test lead port 38 is electrically connected to a terminal of a different one of the main switches 34. Preferably the shrouded meter test lead ports 38 are electrically connected to the inputs of the main switches 34. Each of said main switches 34 also has its input switch terminal in electrical connection to a generator lead of cable 26. One of the shrouded meter test lead ports 38 is connected to B− in order to achieve a connection to system ground which is necessary for some required tests.

Two of the multiple conductive circuit paths 44 are field winding circuit paths 54. The field winding is sometimes referred to by other names such as "Rotor Winding", "Alternator Rotor Winding" or "Excitation Field Winding". On some generators the field winding has a direct connection to the generator controller through a set of carbon brushes and slip/collector rings. On other generators the field winding connection is brushless. The field winding circuit paths 54 are adapted for connection to a field winding 56 of the generator 12. One of the main switches 34 is a double pole single throw main field winding switch 34A which has each of its poles interposed in series in a different one of the two field winding circuit paths 54. The input terminals of the main field winding switch 34A are connected to the two field winding conductors of the generator leads in cable 26.

A double pole double throw battery switch 36 has each of its poles interposed in series in a different one of the two field winding circuit paths 54. The battery switch 36 has its input terminals electrically connected to an output of a different one of the poles of the main field winding switch 34A. Two of the output terminals of the battery switch 36 are connected to controller leads in controller cable 30. The other two of the output terminals of battery switch 36 are electrically connected to a pair of battery ports B– and B+. The preferred battery ports are formed by a battery port cable 64 (FIG. 3) having battery port connectors 66 at its end for connection to a battery.

A voltage sensing meter 68 is connected between the inputs of the battery switch 36. A current sensing meter 70 (ammeter) is interposed in series with one of the two field winding circuit paths 54. These on-board meters allow the technician to measure the field winding 56 voltage and current directly on the meters 40 (FIG. 3) that are mounted to the cabinet 24. The auxiliary winding provides excitation power and is sometimes referred to by other names such as "Powerboost™ Winding", "DPE Winding" or "Excitation Winding". On some generators this could be considered a "Permanent Magnet Generator". The electrical power generation units of some manufacturers do not provide or use an auxiliary winding. Instead they use the main generator output winding for excitation power. Consequently conductive circuit paths for the auxiliary winding are not required in the invention but preferably would be included for compatibility with electrical power generation units that do have an auxiliary winding.

Another two of the multiple conductive circuit paths 44 are auxiliary winding circuit paths 72 which are adapted for connection to an auxiliary winding 60 of the electromechanical generator 12. Another one of the main switches 34 is a double pole single throw auxiliary winding switch 34B that has its poles interposed in series in a different one of the two auxiliary winding circuit paths 72. The inputs of the auxiliary winding switch 34B are connected to generator leads in the cable 26.

A voltmeter 74 is mounted to the cabinet 24 and is connected between the two auxiliary winding circuit paths 72. An ammeter 76 is mounted to the cabinet 24 and is interposed in series with one of the two of auxiliary winding circuit paths 72. The voltmeter 74 and the ammeter 76 have a terminal connected to a different output of the auxiliary winding switch 34B.

Another two of the multiple conductive circuit paths 44 are armature winding circuit paths 78. They are adapted for connection to an armature winding 48, 50 of the electromechanical generator 12. Another one of the main switches 34 is a double pole single throw armature winding switch 34C having each of its poles interposed in series in a different one of the two armature winding circuit paths 78. The inputs of the armature winding switch 34C are connected to generator leads in the cable 26. Desirably, a voltmeter 80 is connected between outputs of the armature winding switch 34C.

Different manufacturers who make electrical power generation units adopt physically different connectors for their controller connectors 18 and generator connectors 22. Consequently a particular tester/generator connector 28 and a particular tester/controller connector 32 that are used with the invention will not be connectable to the electrical power generation units of some manufacturers. In order to make the invention adaptable to all electrical power generation units, one and preferably more pairs of model-specific adapters are also provided.

Figure 5:
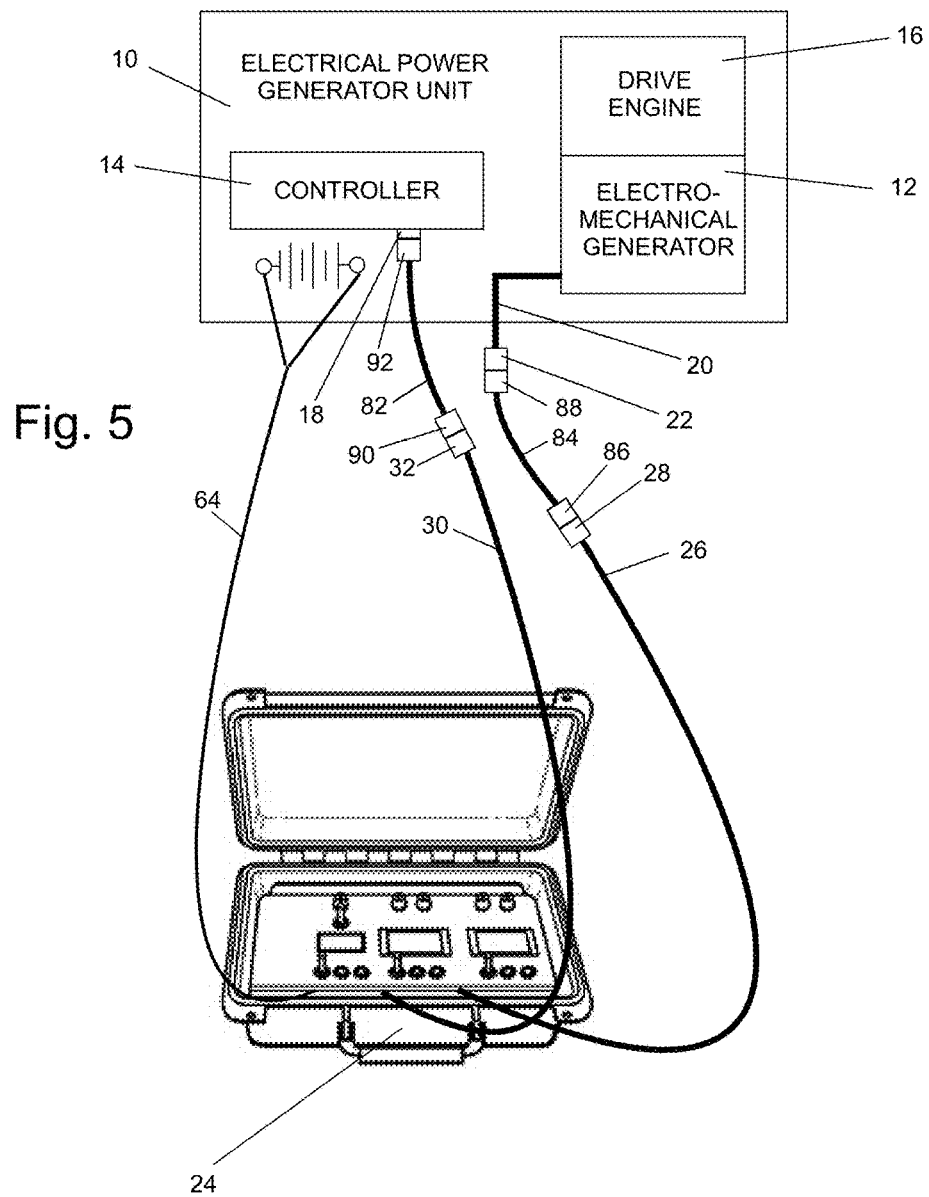
FIG. 5 is a block diagram illustrating the connection of adapters for connecting the embodiment of the invention to an electrical power generation unit made by a manufacturer that does not use connectors that mate with the connectors that are provided with the embodiment of the invention.

The connection of a pair of adapters is illustrated in FIG. 5. A generator adapter 84 has an adapter/generator-cable connector 86 at one end that mates with the tester/generator connector 28. The opposite end of the generator adapter 84 has adapter/generator connector 88 at its opposite end that mates with the generator connector 22. The conductors in the connectors 86 and 88 are electrically connected together, such as by a cable as illustrated. Alternatively, the connectors at the opposite ends of the adapter can be joined directly together and can be formed as a unitary body.

In addition to the generator adapter 84, a controller adapter 82 has an adapter/controller-cable connector 90 at one end that mates with the tester/controller connector 32 and an adapter/controller connector (92) at its opposite end that mates with the controller connector (18). Alternatively, the connectors at the opposite ends of the adapter can be joined directly together and can be formed as a unitary body.

Because there are multiple different manufacturers with their own standard connectors, it is preferred to have multiple pairs of adapters each pair of adapters mating with controller connectors (18) and generator connectors (22) of electrical power generation units manufactured by different manufactures. Adapters for some manufacturers will connect to an interface device that is situated electrically between the generator controller or voltage regulator and the generator.

The invention has been illustrated and described with a preferred embodiment that is principally for a single phase generator. However, it should be apparent to those skilled in the art that the invention is applicable to a three phase generator and that the preferred embodiment can be adapted for use on a three phase generator. For example, additional switches can be added and/or switches having additional poles can be used. One or more additional meters can be mounted to the cabinet 24 such as a meter to monitor voltage regulator output intended to provide power to a light emitting diode on a unique field excitation system used by one or more manufacturers. An additional meter can also be included to monitor the voltage regulator output intended as a signal to an interface device situated electrically between the generator controller or voltage regulator and the generator.

Instead of connecting the controller-to-generator conductors to one pair of mating connectors 18 and 22, the electrical power generation units of some manufacturers distribute those conductors between and connect those conductors to multiple controller connectors (18) and generator connectors (22). Consequently, controller connector 18 and generator connector 22 may each be replaced by two or more individual connectors. Therefore not all conductors that are necessary for connection to the generator testing appliance are available in a single tester/generator connector 28 and a single tester/controller connector 32. As a result adapters can be provided that provide a corresponding number of mating connectors.

Other alternatives are possible because the controller functions of some electrical power generation units may be distributed among multiple modules (including circuit boards or packages), each with its own physically separate cable, instead of being in a single module. There are usually three main circuit components of the controller and they can be located all in the same module or distributed in two or three different modules. The three main circuit components of the controller are usually an engine speed governor, an engine controller and a generator voltage regulator. In those cases the invention and its conductive circuit paths can be interposed between all of the conductors of all the physically separate modules and their cables. To do that the invention may be provided with additional connectors and cables for connecting the invention to all the physically separate cables and may use multiple additional cables for doing so. The principal concern of the service technician is usually the voltage regulator component of the controller. Consequently embodiments of the invention may be provided with fewer conductive circuit paths or be connected to fewer than all three main controller components. Some electrical power generation units use an interface circuit in a separate module that has its own separate cable. In that case the invention may have additional cables and connectors for connecting to the interface circuit. But in these cases the conductive circuit paths of the invention are still connected between the controller module, or multiple component controller modules, and the electrical generator to provide circuit paths that can electrically connect the controller or multiple component controller modules to the electromechanical generator in the manner they are connected during normal operation of the electrical power generation unit.

From the above description of the invention, the ease and speed of interposing the invention between the controller 14 and the electro-mechanical generator 12 can be appreciated. First, the controller is disconnected from the electro-mechanical generator by separating the generator connector 22 from the controller connector 18. Then the tester/controller connector 32 is connected to the controller connector 18 and the tester/generator connector 28 is connected to the generator connector 22. That completes the connection of the invention to the electrical power generation unit 10. The technician is immediately able to begin the various testing procedures. All necessary circuit nodes of the generator are available for taking measurements of circuit operating parameter by means of a multimeter. Some measurements can be made using the onboard voltmeters and ammeters. By switching the main switches 34 one or more of the windings of the generator can be selectively disconnected from the controller according to the testing procedures recommended by the manufacturer of the electrical power generation unit 10. If adapters are needed, before the invention is connected to the electrical power generation unit the appropriate adapters are connected to the cables 26 and 30.

REFERENCE NUMBERS electrical power generation unit 10
electromechanical generator 12
controller 14
internal combustion engine 16
controller connector 18
cable 20
generator connector 22
appliance cabinet 24
generator cable 26
tester/generator connector 28
controller cable 30
tester/controller connector 32
main switches 34 (34A, 34B, and 34C)
main field winding switch 34A
auxiliary winding switch 34B
armature winding switch 34C
battery switch 36
multimeter test lead ports 38
voltage and current meters 40
fuses 42
conductive circuit paths 44
neutral circuit path 46
armature windings 48, 50
additional unswitched circuit path 52
field winding circuit path 54
field winding 56
auxiliary winding 60
battery ports 62
battery port cable 64
battery port connectors 66
voltage meter 68
ammeter 70
auxiliary winding circuit paths 72
voltmeter 74
ammeter 76
armature winding circuit paths 78
voltmeter 80
controller adapter 82
generator adapter 84
adapter/generator-cable connector 86
adapter/generator connector 88
adapter/controller-cable connector 90
adapter/controller connector 92

This detailed description in connection with the drawings is intended principally as a description of the presently preferred embodiments of the invention, and is not intended to represent the only form in which the present invention may be constructed or utilized. The description sets forth the designs, functions, means, and methods of implementing the invention in connection with the illustrated embodiments. It is to be understood, however, that the same or equivalent functions and features may be accomplished by different embodiments that are also intended to be encompassed within the spirit and scope of the invention and that various modifications may be adopted without departing from the invention or scope of the following claims.

The invention claimed is:

1. A generator testing appliance for use in servicing an electrical power generation unit and for facilitating the testing of its components including an electrical generator that, during normal operation, is connected to and controlled by a controller, the generator having a plurality of electrical generator terminals each connected to a circuit node of the electrical generator, the controller having a plurality of electrical controller terminals each connected to a circuit node of the controller, the generator and controller terminals being directly connected together by electrical conductors during normal operation of the generator, the generator testing appliance comprising:

(a) a cabinet for housing at least some of the components of the generator testing appliance;

(b) multiple conductive circuit paths within the cabinet each circuit path having an electrically interposed switch that is mounted to the cabinet, manually operable from the exterior of the cabinet and adapted for selectively and manually opening and closing the conductive circuit path in which the main switch is connected;

(c) multiple conductor controller leads each controller lead having an end connected to a first end of a different one of the conductive circuit paths and an opposite end connected or connectable to a different one of the controller terminals;

(d) multiple conductor generator leads each generator lead having an end connected to a second end of a different one of the conductive circuit paths and an opposite end connected or connectable to a different one of the electrical generator terminals; and (e) multiple meter test lead ports mounted to the cabinet and accessible from the exterior of the cabinet, each test lead port electrically connected to a terminal of a different one of the main switches.

2. A generator testing appliance in accordance with claim 1 wherein each of said main switches has an input switch terminal in electrical connection to a generator lead and the meter test lead ports are electrically connected to the input switch terminals.

3. A generator testing appliance in accordance with claim 2 wherein:

(a) the generator terminals are connected to a generator connector (22) and the controller terminals are connected to a controller connector (18); and (b) the multiple conductive circuit paths each have opposite ends,
(i) one end of each circuit path being electrically connected through the generator leads to a tester/generator connector (28) that is accessible at the exterior of the cabinet and mates with the generator connector (22), and
(ii) the opposite end of each circuit path being electrically connected through the controller leads to a tester/controller connector (32) that is accessible at the exterior of the cabinet and mates with the controller connector (18).

4. A generator testing appliance in accordance with claim 3 and further comprising a pair of model-specific adapters (82, 84), the pair of adapters (82, 84) including (a) a generator adapter (84) comprising an adapter/generator-cable connector (86) at one end that mates with the tester/generator connector (28) and an adapter/generator connector (88) at an opposite end that mates with the generator connector (22) and (b) a controller adapter (82) having an adapter/controller-cable connector (90) at one end that mates with the tester/controller connector (32) and an adapter/controller connector (92) at an opposite end that mates with the controller connector (18).

5. A generator testing appliance in accordance with claim 4 and further comprising multiple pairs of adapters each pair of adapters mating with controller connectors (18) and generator connectors (22) of electrical power generation units manufactured by different manufactures.

6. A generator testing appliance in accordance with claim 2 wherein (a) two of said multiple conductive circuit paths are field winding circuit paths adapted for connection to a field winding of the generator;

(b) one of the main switches is a double pole single throw main field winding switch having each of its poles interposed in series in a different one of the two field winding circuit paths and having its input connected to generator leads; and (c) a double pole double throw battery switch has each of its poles interposed in series in a different one of the two field winding circuit paths, the double pole double throw field winding switch having its input terminals electrically connected to an output of a different one of the main field winding switch poles, having two of its output terminals connected to controller leads and having two of its output terminals electrically connected to a pair of battery ports.

7. A generator testing appliance in accordance with claim 6 wherein a voltage sensing meter is connected between the inputs of the battery switch and a current sensing meter is interposed in series with one of said two field winding circuit paths.

8. A generator testing appliance in accordance with claim 2 wherein:

(a) two of said multiple conductive circuit paths are auxiliary winding circuit paths adapted for connection to an auxiliary winding of the generator; and (b) one of the main switches is a double pole single throw auxiliary winding switch having of its poles interposed in series in a different one of the two auxiliary winding circuit paths and having its inputs connected to generator leads.

9. A generator testing appliance in accordance with claim 8 wherein:

a voltage sensing meter is mounted to the cabinet and connected between said two auxiliary winding circuit paths and a current sensing meter is mounted to the cabinet and interposed in series with one of said two of said auxiliary winding circuit paths, the voltage sensing meter and the current sensing meter having a terminal connected to different output of the auxiliary winding switch.

10. A generator testing appliance in accordance with claim 2 wherein:

(a) two of said multiple conductive circuit paths are armature winding circuit paths adapted for connection to an armature winding of the generator; and (b) one of the main switches is a double pole single throw armature winding switch having its poles interposed in series in a different one of the two armature winding circuit paths and having its inputs connected to generator leads.

11. A generator testing appliance in accordance with claim 10 wherein:

a voltage sensing meter is connected between outputs of the armature winding switch.

* * * * *